(12) United States Patent
Prasad H

(10) Patent No.: US 12,206,532 B1
(45) Date of Patent: Jan. 21, 2025

(54) WIRELINE RECEIVER SAMPLING CIRCUIT

(71) Applicant: Cadence Design Systems, Inc., San Jose, CA (US)

(72) Inventor: Ramdas Prasad H, Kerala (IN)

(73) Assignee: Cadence Design Systems, Inc., San Jose, CA (US)

( * ) Notice: Subject to any disclaimer, the term of this patent is extended or adjusted under 35 U.S.C. 154(b) by 64 days.

(21) Appl. No.: 18/329,774

(22) Filed: Jun. 6, 2023

(51) Int. Cl.
*H04L 25/49* (2006.01)
*H03K 3/037* (2006.01)
*H03K 5/02* (2006.01)
*H04B 1/16* (2006.01)
*H04L 27/06* (2006.01)

(52) U.S. Cl.
CPC ......... *H04L 25/4917* (2013.01); *H03K 3/037* (2013.01); *H03K 5/02* (2013.01); *H04B 1/16* (2013.01); *H04L 27/06* (2013.01)

(58) Field of Classification Search
CPC ........ H04L 27/06; H04L 25/4917; H04B 1/16
See application file for complete search history.

(56) References Cited

U.S. PATENT DOCUMENTS

| | | | |
|---|---|---|---|
| 5,036,473 A | 7/1991 | Butts | |
| 5,109,353 A | 4/1992 | Sample et al. | |
| 5,475,830 A | 12/1995 | Chen et al. | |
| 5,551,013 A | 8/1996 | Beausoleil et al. | |
| 5,960,191 A | 9/1999 | Sample et al. | |
| 6,009,256 A | 12/1999 | Tseng et al. | |
| 6,035,117 A | 3/2000 | Beausoleil et al. | |
| 6,051,030 A | 4/2000 | Beausoleil et al. | |
| 6,618,698 B1 | 9/2003 | Beausoleil et al. | |
| 7,739,093 B2 | 6/2010 | Beausoleil et al. | |
| 9,699,009 B1 * | 7/2017 | Ainspan | H04L 25/49 |
| 11,095,487 B1 * | 8/2021 | Yonar | H04L 25/03885 |
| 11,770,274 B1 * | 9/2023 | Liu | H04L 25/03057 |
| | | | 375/233 |
| 2005/0069067 A1 * | 3/2005 | Zerbe | H04L 25/4917 |
| | | | 375/353 |
| 2007/0205818 A1 * | 9/2007 | Fiedler | H04L 25/063 |
| | | | 327/217 |
| 2009/0060083 A1 * | 3/2009 | Hwang | H04L 25/4917 |
| | | | 375/286 |
| 2013/0156126 A1 * | 6/2013 | Chung | H04L 27/06 |
| | | | 375/268 |
| 2022/0182264 A1 * | 6/2022 | Yang | H04L 25/0212 |
| 2024/0323066 A1 * | 9/2024 | Yamamoto | H04L 27/01 |

* cited by examiner

*Primary Examiner* — Patrick O Neill
(74) *Attorney, Agent, or Firm* — Mark H. Whittenberger; Holland & Knight LLP

(57) ABSTRACT

Embodiments included herein are directed towards sampling circuits and methods of using the same. Embodiments may include a data sense amplifier circuit and a reference sense amplifier circuit directly connected with the data sense amplifier circuit. Embodiments may further include a latch circuit configured to receive a first input from the data sense amplifier circuit and a second input from the reference sense amplifier circuit. The latch circuit may be further configured to generate a least significant bit output based upon, at least in part, the first input and the second input.

20 Claims, 5 Drawing Sheets

WIRELINE RECEIVER SAMPLING CIRCUIT

FIELD OF THE INVENTION

The present disclosure relates to electronic circuit transmission architecture, and more particularly, to a receiver architecture for high speed memory interfaces (e.g., Pulse Amplitude Modulation ("PAM")).

BACKGROUND

Functional verification systems, including hardware emulation systems and simulation acceleration systems, utilize interconnected programmable logic chips or interconnected processor chips. Examples of systems using programmable logic devices are disclosed in, for example, U.S. Pat. No. 6,009,256 entitled "Simulation Emulation System and Method," U.S. Pat. No. 5,109,353 entitled "Apparatus for emulation of electronic hardware system." U.S. Pat. No. 5,036,473 entitled "Method of using electronically reconfigurable logic circuits," U.S. Pat. No. 5,475,830 entitled "Structure and method for providing a reconfigurable emulation circuit without hold time violations," and U.S. Pat. No. 5,960,191 entitled "Emulation system with time-multiplexed interconnect." U.S. Pat. Nos. 6,009,256, 5,109,353, 5,036,473, 5,475,830, and 5,960,191 are incorporated herein by reference. Examples of hardware logic emulation systems using processor chips are disclosed in, for example, U.S. Pat. No. 6,618,698 "Clustered processors in an emulation engine," U.S. Pat. No. 5,551,013 entitled "Multiprocessor for hardware emulation," U.S. Pat. No. 6,035,117 entitled "Tightly coupled emulation processors," U.S. Pat. No. 6,051,030 entitled "Emulation module having planar array organization," and U.S. Pat. No. 7,739,093 entitled "Method of visualization in processor based emulation system." U.S. Pat. Nos. 6,618,698, 5,551,013, 6,035,117, 6,051,030, and 7,739,093 are incorporated herein by reference.

Functional verification systems help to shorten the time it takes to design a customized application specific integrated circuits (ASICs) by allowing designers to emulate the functionality of the ASIC before a production run of the ASIC has begun. Functional verification systems help to ensure ASICs are designed correctly the first time before a final product is produced.

A particular processor-based hardware functional verification system (sometimes referred to as an "emulator," "emulation system," or the like) may contain numerous emulation chips that transmit data between one another. A serializer/deserializer (SerDes) is typically used to allow a large amount of data to transmit between chips, while minimizing the number of input/output (I/O) pins and interconnects needed by converting data between parallel interconnections within the chip to a serial signal transmitted on the interconnection between chips in each direction. The receiving chip then converts the serial interconnection back into a parallel interconnection.

The serial interconnect may encode the data to be transmitted. Encoding involves transforming the data bits to be transmitted into a new set of bits (or characters) to be transmitted. The number of encoded bits or characters is generally greater than the number of original data bits for a given word. Such encoding may be desired to reduce the DC component, also known as disparity or bias, of the transmitted signal, or add or modify bits for various transmission purposes, including synchronization, clock recovery, word alignment, error correction, error mitigation, tracking, or routing.

Some types of SerDes (e.g., PAM4-6 224 Gb/s SerDes) have stringent bandwidth requirements to minimize inter-symbol interference (ISI) and improve symbol error rate (SER). It is therefore desirable to have a high-bandwidth termination network in the analog front end to minimize loss at the highest supported Nyquist frequency (e.g., 56 GHz).

SUMMARY

In one or more embodiments of the present disclosure, a sampling circuit is provided. The sampling circuit may include a data sense amplifier circuit and a reference sense amplifier circuit directly connected with the data sense amplifier circuit. The sampling circuit may further include a latch circuit configured to receive a first input from the data sense amplifier circuit and a second input from the reference sense amplifier circuit, the latch circuit further configured to generate a least significant bit output based upon, at least in part, the first input and the second input.

One or more of the following features may be included. The data sense amplifier circuit and the reference sense amplifier circuit may compete to discharge their respective output voltages. The latch circuit may be an SR latch circuit. An absolute value of a differential input may be compared to a threshold value to generate the least significant bit output. The data sense amplifier circuit and the reference sense amplifier circuit may include a differential pair of transistors.

In one or more embodiments of the present disclosure, a sampling method is provided. The method may include providing a data sense amplifier circuit and a reference sense amplifier circuit electrically connected with the data sense amplifier circuit. The method may further include receiving a first input from the data sense amplifier circuit and a second input from the reference sense amplifier circuit at a latch circuit. The method may also include generating a least significant bit output based upon, at least in part, the first input and the second input.

One or more of the following features may be included. The method may include comparing a respective output voltage of the data sense amplifier circuit and the reference sense amplifier circuit. The latch circuit may include an SR latch circuit. The method may further include comparing an absolute value of a differential input to a threshold value to generate the least significant bit output. The data sense amplifier circuit and the reference sense amplifier circuit may include a differential pair of transistors.

In one or more embodiments of the present disclosure, a pulse amplitude modulation 4-level (PAM4) sampling circuit is provided. The sampling circuit may include a data sense amplifier circuit and a reference sense amplifier circuit. The sampling circuit may further include a latch circuit configured to receive a first input from the data sense amplifier circuit and a second input from the reference sense amplifier circuit. The latch circuit may be further configured to generate a least significant bit output based upon, at least in part, the first input and the second input.

One or more of the following features may be included. The data sense amplifier circuit and the reference sense amplifier circuit may compete to discharge their respective output voltages. The latch circuit may be an SR latch circuit. An absolute value of a differential input may be compared to a threshold value to generate the least significant bit output. The data sense amplifier circuit and the reference sense amplifier circuit may include a differential pair of transistors.

In one or more embodiments of the present disclosure, a pulse amplitude modulation 4-level (PAM4) sampling method is provided. The method may include providing a data sense amplifier circuit and a reference sense amplifier circuit. The method may include receiving a first input from the data sense amplifier circuit and a second input from the reference sense amplifier circuit at a latch circuit. The method may further include generating a least significant bit output based upon, at least in part, the first input and the second input.

One or more of the following features may be included. The method may include comparing a respective output voltage of the data sense amplifier circuit and the reference sense amplifier circuit. The latch circuit may include an SR latch circuit. The method may further include comparing an absolute value of a differential input to a threshold value to generate the least significant bit output. The data sense amplifier circuit and the reference sense amplifier circuit may include a differential pair of transistors that each include three regions of operation during a transition from a reset state to a data settling state.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
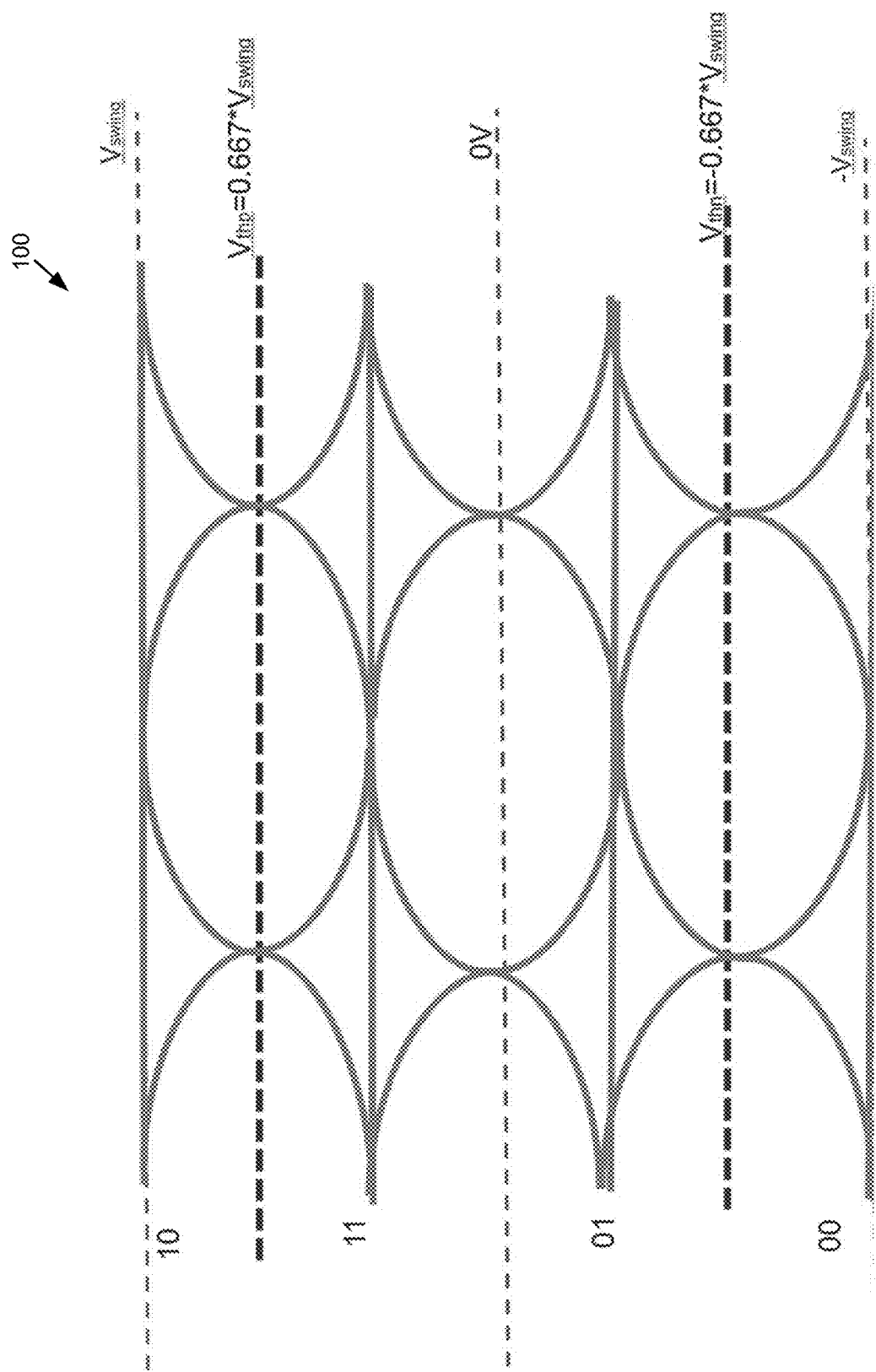
FIG. 1 is a graphical representation of an eye diagram resulting from an ideal PAM4 transmission at a 40 Gbps data rate without equalization.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. Like reference numerals in the drawings denote like elements.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

The adoption of pulse amplitude modulation 4-level (PAM4) over non-return-to-zero (NRZ) in high speed serializer/deserializer (SerDes) wireline receivers introduces new challenges in receiver design. Specifically, the design of samplers able to discern a quaternary symbol tend to be complex and power hungry. Recently, the trend has been for high speed SerDes wireline receivers to switch to PAM4 to achieve higher data rates. The present disclosure aims to reduce the number of samplers required to do PAM4 symbol detection, which in turn helps to reduce the amount of surface area occupied by the circuit while also reducing the amount of power consumed by the circuit. More specifically, this design only requires two samplers, one of which may include a strongarm latch and the other may include a design that has two threshold voltages.

FIG. 1 shows where PAM4 signal generation has three distinct threshold levels to differentiate between four distinct symbols: 00, 01, 11, and 10. As shown in graphical representation 100 two bits of information are contained in each symbol. Ordinarily, a conventional sampler may sample the most significant bit (MSB) without too much difficulty, but detecting the least significant bit (LSB) is not as straight forward and requires more processing. For conventional PAM4 detectors, the detection of the LSB cannot be completed until the MSB is resolved. This is because LSB detection involves two threshold levels as indicated by $V_{thp}$ and $V_{thn}$ in FIG. 1. The MSB decides which threshold level is to be used to resolve the LSB. This inherently creates a constraint in how fast the overall PAM4 symbol may be resolved. Existing approaches attempt to work around this delay by having two independent data paths one having a threshold of $V_{thp}$ and one having a threshold of $V_{thn}$ and subsequently selecting the correct path depending on the resolved value of the MSB. This alleviates the delay to a certain degree but does so at the cost of an additional data path, which increases area and power consumption as well as increasing the complexity of the clock tree necessary to drive the samplers. The present disclosure circumvents this by making the LSB detector capable of independent LSB detection. Hence, substantial power, area and clocking complexity can be reduced.

Figure 2:
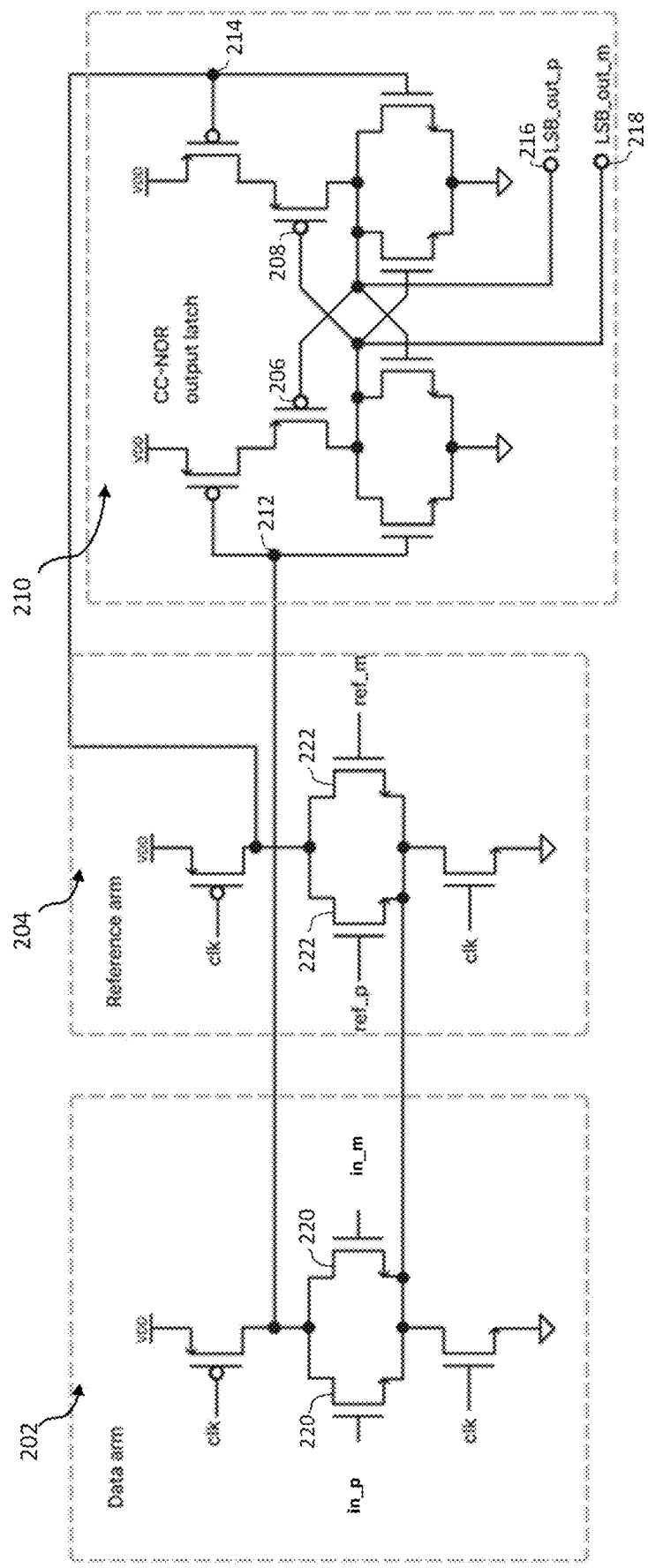
FIG. 2 shows an example network consistent with embodiments of the present disclosure.

Referring now to FIG. 2, sampler circuit 200 is provided. In some embodiments, sampler circuit 200 may use data sense amplifier circuit 202 (a data arm) and reference sense amplifier circuit 204 (a reference arm) to compete with one another to discharge capacitive node 206, 208. The rates of discharge of both data arm 202 and reference arm 204 may be used to determine if there is a high enough differential input magnitude to set the output to logic 0, and if the differential input is not high enough then the output may be set to logic 1. Both data arm 202 and reference arm 204 may be directly connected to latch circuit 210, which may be configured to receive a first input at node 212 from data arm 202 and a second input at node 214 from reference arm 204. Latch circuit 210 may be further configured to use the first input at node 212 and the second input at node 214 to generate an LSB at output node 216 or output node 218. Additionally, both data arm 202 and reference arm 204 include pairs of differential transistors 220, 222, such that data arm 202 includes differential pair 220 and reference arm 204 includes differential pair 222.

In some embodiments, the latch circuit 210 is a set/reset latch (SR latch circuit) 210, which may compare an absolute value of a differential input 212, 214 to a threshold value to generate the least significant bit at output nodes 216, 218. Such embodiments effectively replace the two independent comparators used in conventional LSB detector circuits with one structure that has two symmetrical thresholds about 0V differential. Additionally, a fast SR latch circuit 210 may be used to convert the LSB at output nodes 216, 218 to CMOS Logic, which aids in overcoming the difficulty involved in establishing proper phase relationships between many interleaved ADC paths at very high data rates.

During the transition from the reset state of the sampler to the data settling, the transistors in the differential pair 220, 222 of both arms go through three distinct regions of operation: (i) the cutoff/reset region, (ii) the linear region, and (iii) the triode region (output stable). The decision to classify the LSB as a 0 is made when the data arm can discharge output node 216 out faster than the reference arm can discharge output node 218. Since in the reset state either pair of differential transistors 220, 222 has a gate source voltage ($V_{gs}$) of zero and in the third state, the absolute maximum voltage between the drain and the source ($V_{ds}$) is minimized due to discharging of the first stage output nodes. Accordingly, the highest currents and thus the biggest impact on the fall-time of output nodes 216, 218 is made when the differential pairs 220, 222 are in the linear region of operation where the output nodes 216, 218 are transitioning.

Further, during the transition in the linear region, the effective impedance looking into the drain would be $R_{ds}=V_{ds}/(K*W/L*(V_{gs}-V_{th})2)$ or $R_{ds} \alpha 1/(V_{gs}-V_{th})^2$. This means that if either $IN_P$ or $IN_M$ from data arm 202 is driven higher than the gates of the references branch transistors (which are at $V_{ref}$) there will be a threshold voltage $V_{thresh}$ ($V_{ref}$) where $Z_{out}GND>Z_{out\_ref}GND$. At this point, the output at node 216 will be discharged faster than the output at node 218. The SR latch circuit 210 will be released from reset as soon as either node moved from $V_{dd}$ will regenerate the difference and latch the output nodes 216, 218 to GND and $V_{dd}$ respectively. Hence $V_{thp}=V_{thresh}(V_{ref})$ and $V_{thn}=-V_{thresh}(V_{ref})$. The relationship between $V_{thresh}$ and $V_{ref}$ due to reference arm 204 having half the impedance of the data arm 202 uses competing data sense amplifier 202 and reference sense amplifier 204 to do LSB detection.

For sense amplifiers an important criteria that determines the clock-to-Q (C2Q) delay is the strength of the tail switch, where C2Q is a measure of how fast the output of the circuit resolves when a clock edge triggers sampling. The faster the switch activates and the lower its impedance to GND the better the speed may be of the sense amplifier structure 204. For the circuit structure 200, in FIG. 2, when the data arm 202 has one of its inputs at a significantly higher voltage than the other it will be harder for the tail of data arm 202 switch to turn on due to the lower impedance seen to the node 212. Thus, re-using the switches of reference arm 204 for discharging the tail of data-arm 202 ensures a faster discharge of the tail data-arm 202 tail and thus a faster overall response of the circuit.

The circuit structure 300 in FIG. 3 ensures the tail nodes settle during reset at one transistor threshold voltage below the average voltage (common-mode voltage) supplied to the gates of each branch. When the tail nodes are connected together as in FIG. 2, the data arm and reference arms are not allowed to settle at independent tail node voltages but are rather forced to settle at a common voltage. Hence, when the data arm's gates are both connected to high voltages (implies a high common-mode voltage), there may be a point where the data arm has lower impedance to GND than the reference arm. This may result in a false detection of LSB. Hence, the stage that precedes this sampler in the datapath must have good common-mode rejection.

Figure 3:
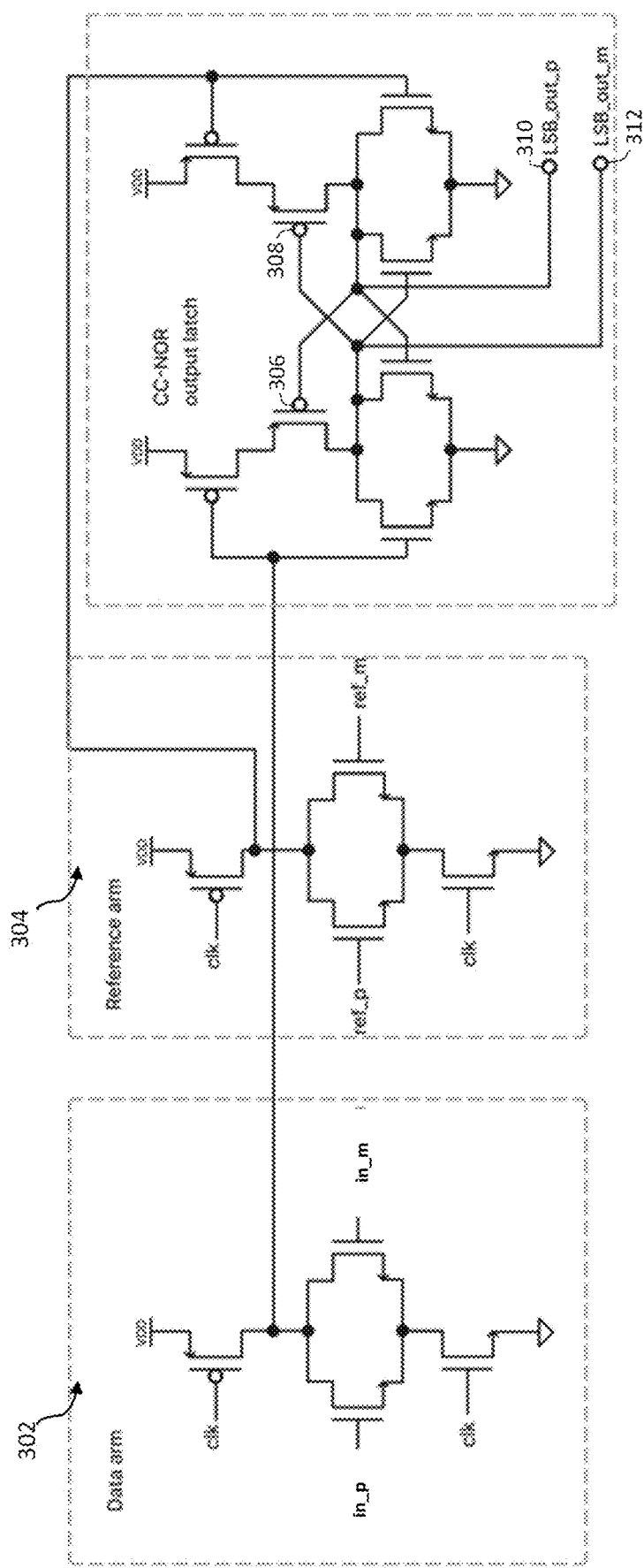
FIG. 3 shows an example network consistent with embodiments of the present disclosure.

This means that the structure in FIG. 2 is more likely to trigger in the presence of a high input common-mode voltage than the structure in FIG. 3. Hence, circuit structure 200 in FIG. 2 has a lower common-mode rejection than the circuit structure 300 in FIG. 3.

FIG. 3 shows a sampler circuit 300 also using a data sense amplifier circuit 302 (a data arm) and a reference sense amplifier circuit 304 (a reference arm) to compete with one another to discharge a capacitive node 306, 308. For low differential swings, output node 310 of reference arm 304 falls to GND faster than data arm 302, and output node 312 of data arm 302 falls to GND faster than reference arm 304 when the differential swing of $IN_P$ or $IN_M$ from data arm 302 is high enough. Sampler circuit 300 offers almost equally fast C2Q compared to strongarm and sense amplifier based latches. In some embodiments, the stages used do not have static power consumption, i.e., they may not employ current mode logic (CML). Additionally, under circuit topology 300 one sampler may perform the function of two, hence it may occupy a smaller surface area and require lower power consumption, lower clock tree and support logic complexity. More specifically, the present disclosure uses a single reference voltage to set the two symmetrical threshold voltages about 0V differential. These thresholds are highly symmetric, and their on-chip variation may be highly correlated to one other. Further, as the data-path may be easily available to probing, this topology offers a more reliable detection scheme.

Figure 4:
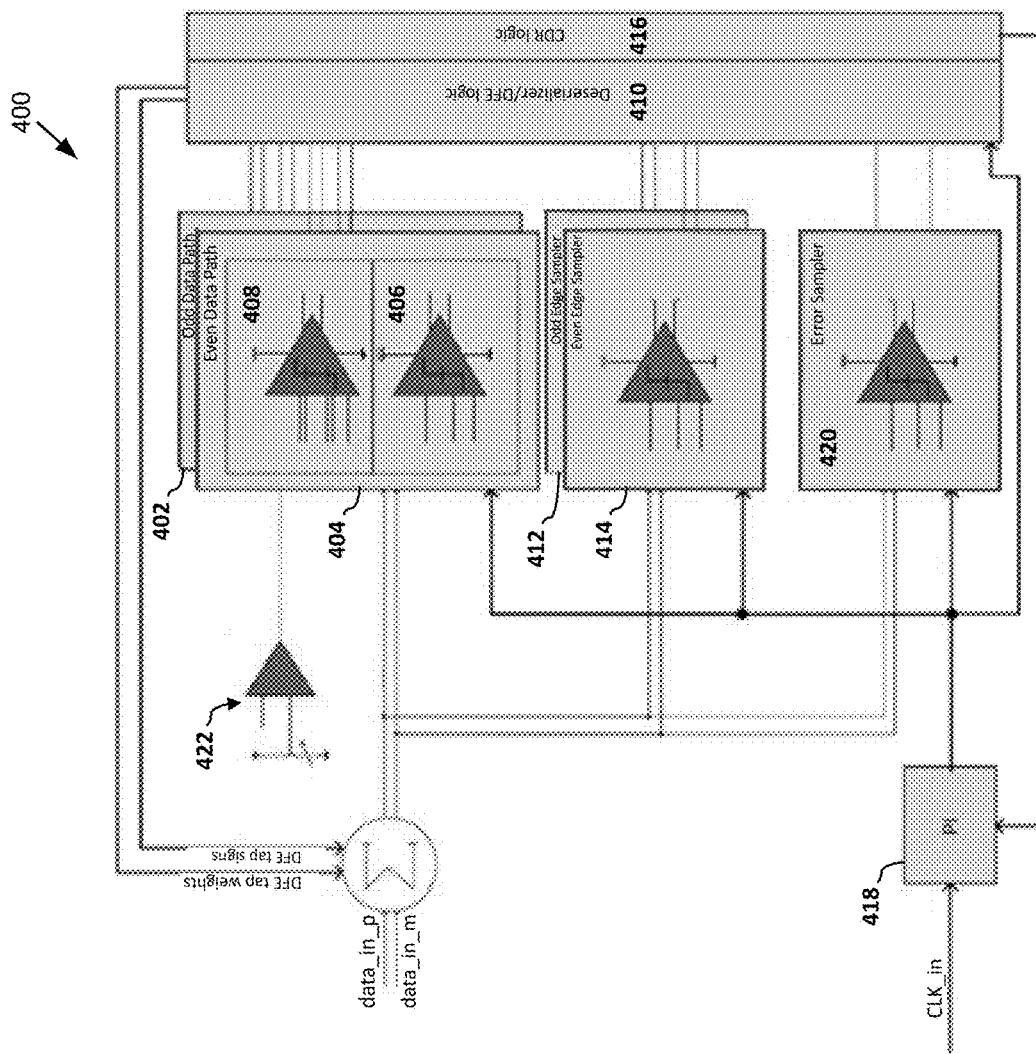
FIG. 4 shows a dual path implementation of an LSB sampler consistent with embodiments of the present disclosure.

Now referring to FIG. 4, a sampler circuit 400 consistent with embodiments of the present disclosure is provided. In some embodiments, sampler circuit 400 may include an odd path 402 and an even path 404, where odd path 402 may be triggered on a rising edge of the clk0 input signal and where even path 404 may be active on the falling edge. This dual path architecture may be used to lower the clock frequency required, which, in turn, conserves the power needed to drive very high frequency clocks. Each data path 402, 404 may include one conventional sampler to resolve MSB and one instance of the sampler design for LSB detection. In FIG. 4, data path 404 shows the conventional sampler 406 directly below the LSB sampler 408, while neither the MSB sampler nor the LSB sampler are illustrated for data path 402.

In some embodiments, the output of data paths 402, 404 may be selected based on the valid clock edge in the SerDes/DFE 410 logic and then fed back into the summer stage for decision feedback equalization (DFE), where the summer stage may include one or more "taps" that add or subtract weighted versions of previously detected symbols to equalize the inter symbol interference (ISI) created by the channel. Each data path may be related to an edge sampler, such that odd data path 402 relates to an odd edge sampler 412, and even data path 404 relates to an even edge sampler 414. Odd edge sampler 412 and even edge sampler 414 may both be driven by quadrature clocks, which represent 90 degree phase shifted versions of the clk0 input signal. The edge samplers 412, 414 may be used by the clock data recovery (CDR) block 416 to control outputs of the phase interpolator (PI) 418 by means of phase rotation, in order to track the optimum sampling instant in the data unit interval (UI). One or more error samplers 420 may be driven by a special clock path and used to probe the equalized data and tune the tap coefficients of the DFE as well any continuous time linear equalizer (CTLE) that may/may not be present in the particular wireline receiver the DFE is used in. In some embodiments, an additional reference creation block 422 may be added to the DFE to aid in the generation of the reference voltage that controls the threshold of the LSB detector.

Figure 5:
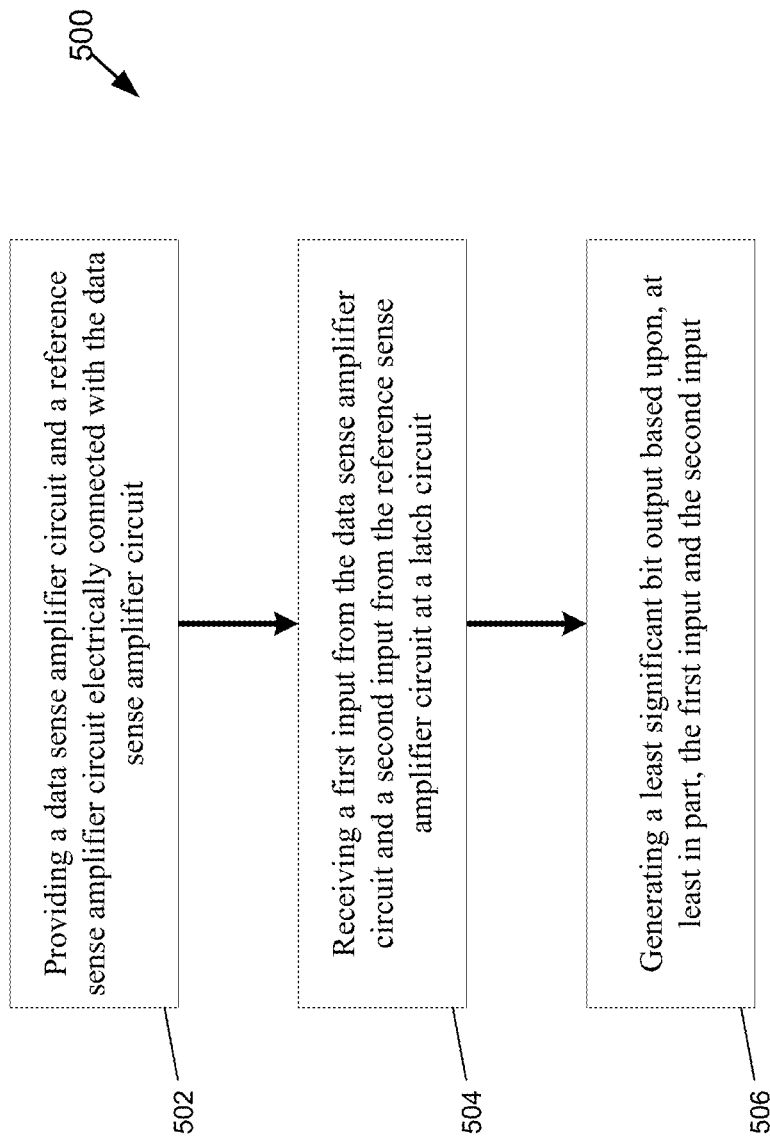
FIG. 5 shows a flowchart depicting one or more operations consistent with embodiments of the present disclosure.

Referring now to FIG. 5, a flowchart depicting operations consistent with the present disclosure is provided. The method may include providing 502 a data sense amplifier circuit and a reference sense amplifier circuit electrically connected with the data sense amplifier circuit. The method may include receiving 504 a first input from the data sense amplifier circuit and a second input from the reference sense amplifier circuit at a latch circuit. The method may further include generating 506 a least significant bit output based upon, at least in part, the first input and the second input. In some embodiments, the method may further include comparing a respective output voltage of the data sense amplifier circuit and the reference sense amplifier circuit. In still other embodiments the method may also include comparing an absolute value of a differential input to a threshold value to generate the least significant bit output.

Numerous other operations are also within the scope of the present disclosure. It will be apparent to those skilled in the art that various modifications and variations can be made in embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A sampling circuit comprising:
 a data sense amplifier circuit;
 a reference sense amplifier circuit directly connected with the data sense amplifier circuit; and
 a latch circuit configured to receive a first input from the data sense amplifier circuit and a second input from the reference sense amplifier circuit, the latch circuit further configured to generate a least significant bit output based upon, at least in part, the first input and the second input.

2. The sampling circuit of claim 1, wherein the data sense amplifier circuit and the reference sense amplifier circuit compete to discharge their respective output voltages.

3. The sampling circuit of claim 1, wherein the latch circuit is a set/reset (SR) latch circuit.

4. The sampling circuit of claim 1, wherein an absolute value of a differential input is compared to a threshold value to generate the least significant bit output.

5. The sampling circuit of claim 1, wherein the data sense amplifier circuit and the reference sense amplifier circuit include a differential pair of transistors.

6. A sampling method comprising:
 providing a data sense amplifier circuit and a reference sense amplifier circuit electrically connected with the data sense amplifier circuit;
 receiving a first input from the data sense amplifier circuit and a second input from the reference sense amplifier circuit at a latch circuit; and
 generating a least significant bit output based upon, at least in part, the first input and the second input.

7. The sampling method of claim 6, further comprising:
 comparing a respective output voltage of the data sense amplifier circuit and the reference sense amplifier circuit.

8. The sampling method of claim 6, wherein the latch circuit is a set/reset (SR) latch circuit.

9. The sampling method of claim 6, further comprising:
 comparing an absolute value of a differential input to a threshold value to generate the least significant bit output.

10. The sampling method of claim 6, wherein the data sense amplifier circuit and the reference sense amplifier circuit include a differential pair of transistors.

11. A pulse amplitude modulation 4-level (PAM4) sampling circuit comprising:
 a data sense amplifier circuit;
 a reference sense amplifier circuit; and
 a latch circuit configured to receive a first input from the data sense amplifier circuit and a second input from the reference sense amplifier circuit, the latch circuit further configured to generate a least significant bit output based upon, at least in part, the first input and the second input.

12. The sampling circuit of claim 11, wherein the data sense amplifier circuit and the reference sense amplifier circuit compete to discharge their respective output voltages.

13. The sampling circuit of claim 11, wherein the latch circuit is a set/reset (SR) latch circuit.

14. The sampling circuit of claim 11, wherein an absolute value of a differential input is compared to a threshold value to generate the least significant bit output.

15. The sampling circuit of claim 11, wherein the data sense amplifier circuit and the reference sense amplifier circuit include a differential pair of transistors.

16. A pulse amplitude modulation 4-level (PAM4) sampling method comprising:
 providing a data sense amplifier circuit and a reference sense amplifier circuit;
 receiving a first input from the data sense amplifier circuit and a second input from the reference sense amplifier circuit at a latch circuit; and
 generating a least significant bit output based upon, at least in part, the first input and the second input.

17. The sampling method of claim 16, further comprising:
 comparing a respective output voltage of the data sense amplifier circuit and the reference sense amplifier circuit.

18. The sampling method of claim 16, wherein the latch circuit is an SR latch circuit.

19. The sampling method of claim 16, further comprising:
 comparing an absolute value of a differential input to a threshold value to generate the least significant bit output.

20. The sampling method of claim 16, wherein the data sense amplifier circuit and the reference sense amplifier circuit include a differential pair of transistors that each include three regions of operation during a transition from a reset state to a data settling state.

* * * * *